United States Patent [19]
Hulkko

[11] Patent Number: 5,471,652
[45] Date of Patent: Nov. 28, 1995

[54] FREQUENCY SYNTHESIZER AND MULTIPLIER CIRCUIT ARRANGEMENT FOR A RADIO TELEPHONE

[75] Inventor: Jaakko Hulkko, Oulu, Finland

[73] Assignee: Nokia Mobile Phones Ltd., Salo, Finland

[21] Appl. No.: 96,864

[22] Filed: Jul. 26, 1993

[30] Foreign Application Priority Data

Jul. 28, 1992 [FI] Finland ................................. 923412

[51] Int. Cl.$^6$ ................................................. H04B 1/50
[52] U.S. Cl. ..................... 455/76; 455/87; 455/112; 455/180.3; 455/183.1; 455/188.2; 455/260
[58] Field of Search ............................ 455/33.1, 76, 84, 455/86, 87, 89, 112, 118, 180.2, 180.3, 188.2, 190.1, 259, 260, 183.1, 183.2; 379/58, 59; 370/29, 32; 331/2, 74

[56] References Cited

U.S. PATENT DOCUMENTS

| | | | |
|---|---|---|---|
| 4,377,871 | 3/1983 | Borras et al. | 455/76 |
| 4,969,210 | 11/1990 | Hansen et al. | 455/188 |
| 5,175,729 | 12/1992 | Borras et al. | 455/76 X |
| 5,392,460 | 2/1995 | Mattila | 455/76 |

FOREIGN PATENT DOCUMENTS

| | | |
|---|---|---|
| 0398688A3 | 11/1990 | European Pat. Off. . |
| 0541305A1 | 5/1993 | European Pat. Off. . |
| 923412 | 3/1993 | Finland . |
| 2188212 | 9/1987 | United Kingdom . |
| WO91/07828 | 5/1991 | WIPO ............... H04B 1/38 |
| WO92/02991 | 2/1992 | WIPO ............... H04B 1/40 |

OTHER PUBLICATIONS

Forrester, T. D., "Synthesized FM Transceiver", Wireless World, vol. 83, No. 1503, pp. 84–86, Nov. 1977.
Patent Abstracts of Japan, vol. 6, No. 16 (E–92) Jan. 29, 1982 and JP–A–56 136 041 (Sanyo Electric Co. Ltd.).
Japan Telecommunication Review, vol. 24, No. 2, Apr. 1982, Tokyo, Japan pp. 148–156 "Improved Land Mobile Telephone Equipment".

*Primary Examiner*—Chi H. Pham
*Attorney, Agent, or Firm*—Perman & Green

[57] ABSTRACT

The invention relates to a general purpose circuit arrangement for a radio telephone wherein the universal application possibilities have been provided by phase-locked circuits (PLL1 to PLL3) and by a multiplier circuit (11, 12) that can be controlled (signals Select x1/x2 and Synte sel./Data) by the processor of the mobile telephone. The second harmonic or the fundamental frequency is selected by the multiplier circuit from the VCO oscillators (61, 62). In this way, the frequencies of the synthesizer circuits (UHF1, UHF2, UHF3) can be set independently of each other and according to the requirements of the respective cellular networks. The central circuits are advantageously integrated into four IC circuits (IC1 to IC4).

10 Claims, 1 Drawing Sheet

FREQUENCY SYNTHESIZER AND MULTIPLIER CIRCUIT ARRANGEMENT FOR A RADIO TELEPHONE

FIELD OF INVENTION

The invention relates to a general purpose circuit arrangement for a radio telephone.

BACKGROUND OF INVENTION

Despite the fairly extensive and universal standardization measures concerning radio telephone systems today, there are a number of different standards in use or about to be taken in use. This is also true for the digital cellular systems, out of which the following can be mentioned: JDC800 (Japan Digital Cordless; frequency range 800 MHz), JDC1500 (1500 MHz), PCN (Private Communications Network; 1500 MHz), the European GSM and the American DAMPS (Dual Mode AMPS).

For these different networks, the manufacturer makes an adaptation in connection with the manufacturing process by selecting, in a well-known way, crystal oscillators and synthesizer circuits having suitable frequencies. However, this results in overlapping and disadvantages in the coordination of the manufacturing of different mobile telephone models.

The present invention provides a circuit arrangement for a radio telephone, comprising at least one frequency synthesizer circuit (UHF1,UHF2,VHF) having an output therefrom and an oscillator (71) having a reference frequency output therefrom, the at least one synthesizer circuit (UHF1, UHF2,VHF) including a corresponding Phase Locked Loop (PLL) circuit (21,22,23) coupled to the reference frequency, and multiplier means (11,12) for frequency multiplying coupled to the output of the at least one synthesizer circuit (UHF1,UHF2,VHF) and operable by a first control signal (select X1/X2) to change the frequency of a signal output from the multiplier means (11,12), thereby selectively changing the operational frequency range of the radio telephone.

An advantage is that a radio telephone incorporating the present invention can be selectively operated in different network standards without having to have many different types of oscillator circuits. This saves on volume, weight and cost and makes such a radio telephone easier to use and more desirable to a user.

SUMMARY OF THE INVENTION

All the requirements of the principal mobile cellular telephones of today have been taken into consideration in the general purpose circuit arrangement of the radio frequency part of the digital mobile telephone according to the invention, in particular, concerning the above mentioned JDC, PCN, GSM, and DAMPS systems. In its basic form, the system uses one common injection or reference oscillator frequency for the phase-locked (PLL) loop circuits of all synthesizer circuits. The reference oscillator frequency can be selected freely and, for example, any standard type, voltage controlled, temperature stabilized crystal oscillators (VcTcXO) can be used as an oscillator. They are commercially available at advantageous prices.

Another characteristic of the invention is that a multiplier means is connected to the outputs of the synthesizer circuits. This "multiplier means" may be any circuit arrangement known as such and allowing the adjustment of, for instance, the operating point of a buffer amplifier of a voltage controlled oscillator circuit (VCO) so that the second harmonic of the VCO signal or of the signal of a synthesizer circuit of UHF band can be used in the 1500 MHz or 1600 MHz mobile telephones, and the fundamental frequency of the VCO circuit in the 800/900 MHz telephones. The operating point is set by a control signal that can, for instance, be transferred from a processor of the mobile telephone and is selected when the mobile telephone is activated according to the system selected. Alternatively, the system information or the value of the control signal of the multiplier means can be stored in the memory of the control processor of the mobile telephone so that the desired control signal will automatically be available when starting next call. The advantage of the use of the "multiplier means" is that the same mobile telephone equipment architecture can be used for both the 800/900 MHz and the 1500/1600 MHz cell systems.

According to a second aspect of the invention, the frequency of each synthesizer circuit can be set at a preselected frequency by a second control signal generated by the processor of the mobile telephone, to be selected according to the system as above. This measure allows the realisation of the frequencies required at any time by the necessary different system/channel selections. Further, the use of this second control signal allows the selection of the different frequencies in the reception and transmission branch, for instance, so that the reception frequency can be changed without changing the transmission frequency, as required in the American Dual Mode AMPS system (DAMPS) where both analogue and digital operation modes are used. Considering the DAMPS system, in the circuit arrangement according to the invention, both transmission and reception are feasible simultaneously.

According to another characteristic of the invention, with a third control signal, the mixer of the transmission branch can be assigned to a state where e.g. the mixer will be changed out of balance, so that the frequency of the UHF synthesizer circuit is directly tuned to the final frequency and modulated by an analogue signal. In this case the VHF synthesizer is not used. Respectively, in this operation mode, sampling of the intermediate frequency is connected to the reception branch by a way known to those skilled in the art. This is when the arrangement according to the invention can be used in the analogue cell telephones and also in the DAMPS telephones. However, both analogue and digital signal processing branches will be arranged in the DAMPS telephones and the connections between them by one of the known ways.

In digital operation, the circuit arrangement according to the invention comprises in its reception branch a I/Q demodulator by which the I and Q signals will be derived directly from the intermediate frequency. Respectively, in the transmission branch, there is an I/Q modulator that modulates the frequency produced by the VHF synthesizer to be connected to the second mixer.

Further, concerning the characteristics of the circuit arrangement according to the invention, it is worth mentioning that only one intermediate frequency is used in the reception branch. By a way readily understood by those skilled in the art, in the circuit arrangement disclosed here, the transmission signal can be produced by mixing, i.e. that in this connection a pulsed transmitter can be used, the wider stability requirement of which, as far as the transmitter as such is concerned, the presently disclosed circuit arrangement will satisfy. Further, it can be mentioned that, in the arrangement according to the invention, the intermediate and the injection frequencies can be chosen entirely independently from each other for different cellular networks. As an example it may be mentioned that the selection of the intermediate frequency of a GSM mobile telephone is not limited to be a VcTcXO frequency or its harmonic.

The circuit arrangement of the invention may be carried out by four integrated circuits whereto the components of the circuit arrangement are assembled in suitable groups. Two UHF synthesizers operating advantageously at a frequency under 1000 MHz, and one VHF synthesizer operating within the range of 80 to 400 MHz, are assembled from these circuit groups, depending on the selected frequencies and cellular systems. In an alternative embodiment, the voltage controlled oscillators are adapted to the fifth integrated circuit. In the exclusively analogue applications, the fourth integrated circuit with its I/Q demodulator is naturally not needed at all in the use and thus the said analogue signal sampling circuit can be used instead of it.

BRIEF DESCRIPTION OF THE DRAWING

An embodiment of the circuit arrangement according to the invention is illustrated diagrammatically in the drawing showing four integrated circuits.

DETAILED DESCRIPTION OF AN EMBODIMENT OF THE INVENTION

Figure 1:
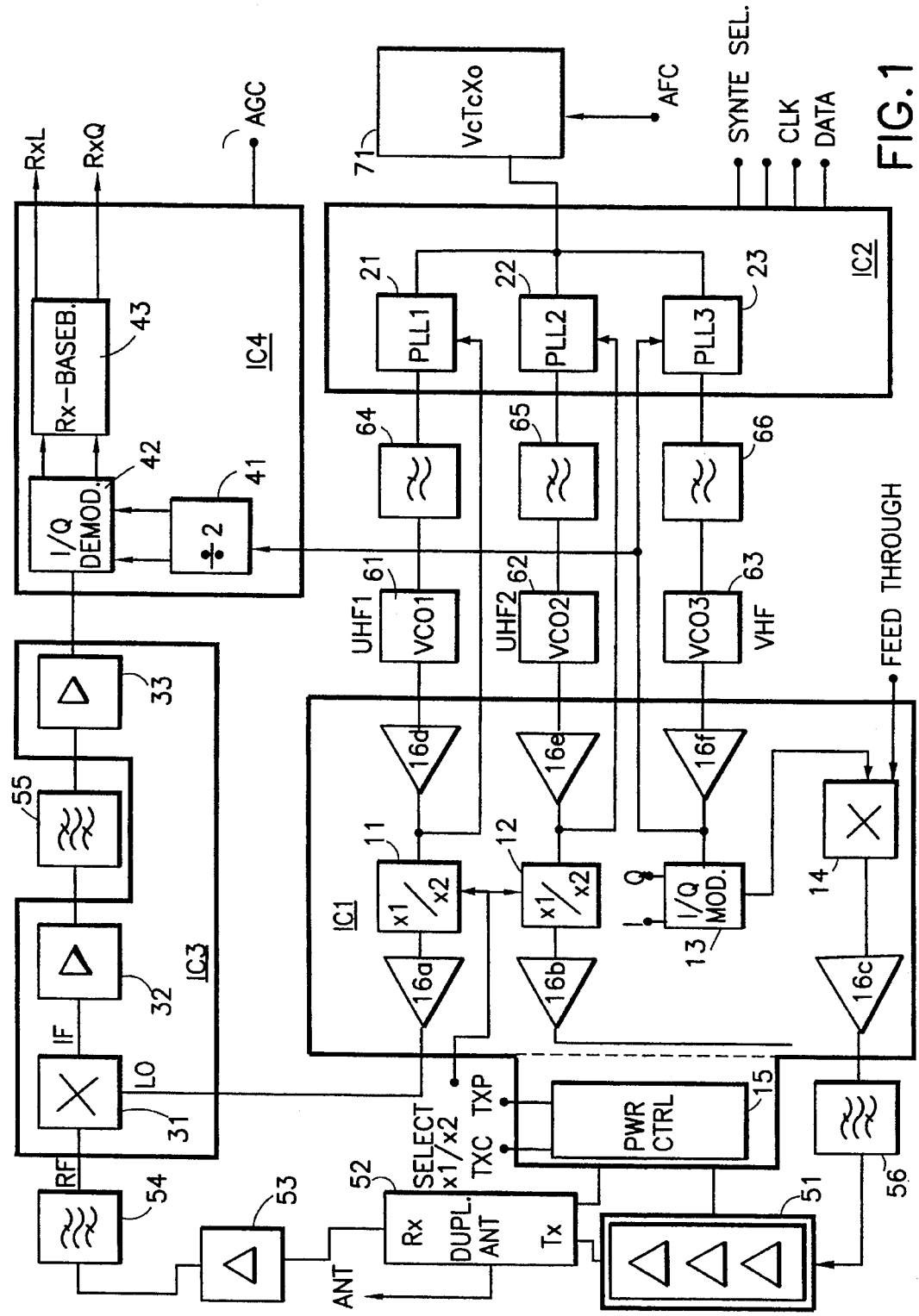

The multi-purpose circuit arrangement of the radio frequency part of the mobile telephone according to the FIGURE comprises four IC circuits IC1 to IC4. Only the operational parts essential to the understanding of the principle of the circuit are shown in the FIGURE, and thus, for instance, no circuit regulators or other low frequency components have been shown because they are components readily understood by those skilled in the art, and which can be incorporated by some of the ways well-known as such. The first circuit IC1 includes a transmitter mixer 14, a I/Q modulator 13 and a multiplier means 11 and 12 plus amplifiers 16a to 16f. The second circuit IC2 includes PLL circuits 21 to 23 of the synthesizers controlled e.g. by the clock input Clk. The third circuit IC3 includes a high frequency mixer 31 of the receiver, with its amplifiers 32, 33, and the fourth circuit IC4 includes a digital I/Q demodulator 42 and baseband frequency circuits 43 (Rx baseband) and a divider 41 by which the oscillator signal taken from the VHF synthesizer circuit, the output signal of the amplifier 16f, is divided by two. Alternatively, a sampling circuit (not shown) can be used in analogue operation instead of the IC4 circuit. VCO circuits 61 to 63 are also included in the circuit arrangement and so are preceding low pass filters 64 to 66. Primarily, the VCO circuits are not designed as integrated circuits but even that is feasible, at least as far as the active components are concerned. The injection frequencies of the PLL circuits 21 to 23 are fed from a VcTcXO 71. In this connection, the circuit IC1 is shown as also including the power control circuit 15 (Pwr Ctrl). The power level of the transmitter is controlled by the signals Txc, Txp that are directed to the circuit 15. The transmission and reception branches (Tx and Rx) have been connected in the usual way through filters and amplifiers 56, 51 and 54, 53, respectively, to the duplex filter 52 and further to the antenna ANT through the antenna connector Ant.

The radio frequency signal received by the antenna ANT on the reception side is directed through the duplexer 52 from the output Rx via the amplifier 53 and the passband filter 54 as an input signal RF to the circuit IC3 and within that to mixer 31. The second input of the mixer 31 is the local oscillator signal LO. The output signal of the mixer, at an intermediate frequency, is directed via the amplifier 32 to the passband filter 55 (outside the circuit IC3) and further via the amplifier 33 to the circuit IC4. In the circuit IC4 the if signal is brought to the I/Q demodulator that produces in a known way the I and Q signals for the base frequency circuit 43. After processing these signals they are directed to become the output signals RzI and RxQ of the circuit, to be processed in the base frequency circuits (not shown) of the mobile telephone. The modulating signals being in the mutual 90 degree dephasing stage are brought via the divider 41 to the I/Q modulator during the digital operation. The circuit IC4 and/or IC3 and/or the amplifier 53 are controlled by the control signal of amplification AGC.

The local oscillator signal LO of the receiving side is formed in the first UHF synthesizer circuit (UHF1). There the output frequency of the reference oscillator controlled by the AFC signal is fed to the phase-locked circuit 21 (PLL1) where the reference frequency is processed by a way known as such and fed via the lowpass filter 64 to the voltage controlled oscillator 61 (VCO1) and from there further via the amplifier 16d to the so-called multiplier means 11. The operation point of the buffer amplifier 16a is controlled using the multiplier means and based on the first control signal "Select x1/x2" so that either the second harmonic frequency or the second basic frequency is obtained from the VCO signal. The output of the amplifier 16d is also directed as a feedback to the PLL1 circuit 21 and, on the other hand, to the divider 41 (within circuit IC4).

A radio frequency mixing signal is formed in the second UHF synthesizer branch UHF2 in the transmitting branch, based on the reference frequency of the oscillator 71. The operation of the means 22, 65, 62, 16e, 12 and 16b in the circuit UHF2 is similar to that of the circuit UHF1. However, the output frequencies of the UHF circuits may be selected independently, by setting the operation of the PLL circuits 21 and 22 with the control signals "Synte sel." and "Data" as desired, for instance, by setting the dividing figures of the dividers to be programmed for the desired frequencies, for instance, in order to bring about the frequency values in the table shown below. The output signal of the circuit UHF2 is directed to the second mixer 14.

For the modulation of the digital signal, a signal for the I/Q modulator is formed in the VHF synthesizer circuit in the same way as above in the UHF circuit, but at a lower frequency; there the I and Q signals, in mutual 90 degree dephasing, will modulate the VHF frequency so that the output of the modulator can be added to the second mixer 14 as a modulating signal. The output signal at transmission frequency of the mixer 14 is led via amplification 16c and passband filtration 56 to the power amplifier chain 51 and, in amplified form, further to the input Tx of the duplexer 52 and to the antenna ANT to be transmitted by radiowaves.

In the case of the FM telephone, not shown in the illustration, when the transmission of an analogue signal is desired, the signal of the UHF branch is modulated by the analogue signal, e.g. in connection of VCO2, so that a modulated signal directly in transmission frequency is achieved. Then the mixer 14 is controlled to an unbalanced state by the "Feed through" control signal so that the analogue signal is carried directly in the transmission frequency to the amplifier 51. At this time the VHF branch is switched to become inactive by the signal "Synte sel.".

The functions of the circuit arrangement are thus controlled, for instance, by the processor (not shown) of the mobile telephone and by the controlling quantities "Select x1/2", "Synte sel."/"Data" and "Feed through". Either the second harmonic (x2) of the VCO frequency or the basic frequency (x1) is selected by the select signal to the outputs of the UHF branches. The basic functions of the phase-locked circuits (e.g. on/off, frequency order range) and the divider modules are set by the signals "Synte sel." and "Data". This allows the synthesizers UHF1, UHF2 and VHF to generate frequencies, independently from each other, for the transmission and reception branches.

The JDC application will serve as an example of this frequency setting. The table below shows the frequencies as average ones.

TABLE 1

| Application: | JDC800 | JDC1500 |
|---|---|---|
| Frequency/MHz | | |
| Reception FRx[a] | 818 | 1495 |
| Transmission FTx[b] | 948 | 1447 |
| UHF1-synte Fuhf1[c] | 773 | 782,5 |
| UHF2-synte Fuhf2[d] | 858 | 793,5 |
| VHF-synte Fvhf[e] | 90 | 140 |
| Intermediate fr. if[f] | 45 | 70 |

Notes:
[a] Received frequency in the Rx branch; RF signal in the input of mixer 31.
[b] Transmission frequency in the output of mixer 14.
[c] Frequency in the output of multiplier means 11.
[d] Frequency in the output of multiplier means 12.
[e] Frequency in the output of oscillator 63.
[f] Intermediate frequency in the output of mixer 31.

It was already mentioned above that the frequency of the reference oscillator 71 can be selected as a standard value, e.g. in the range 12 to 16 MHz but, due to the structure of the circuit arrangement according to the invention, the exact value may be selected relatively freely.

We can see in the table above that the frequencies a) to f) follow the conventional lines. Thus, for instance, when JDC800 is concerned:

$$FRx=Fuhf1+Fif=773+45=818 \text{ MHz, and}$$

$$FTx=Fuhf2+Fvhf=858+90=948 \text{ MHz.}$$

The corresponding formulae are valid when using other systems.

Despite the fact that above we have only described the basic circuit block diagram in more detail, those skilled in the art will understand that the different blocks included can be assembled in several ways, known as such, and that the possible inner modifications within the different circuits will not limit the application of the idea of this invention in universal mobile telephones.

In view of the foregoing description it will be evident to a person skilled in the art that various modifications may be made within the scope of the invention.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What we claim is:

1. A circuit arrangement for a radio telephone comprising at least one UHF frequency synthesizer circuit (UHF1, UHF2) and a VHF synthesizer circuit (VHF) each including an output therefrom and an oscillator (71) having a reference frequency output therefrom, said at least one UHF synthesizer circuit and said VHF synthesizer circuit each including a corresponding Phase Locked Loop (PLL) circuit (21, 22) (23) coupled to said oscillator (71) and responsive to said reference frequency output therefrom, multiplier means (11, 12) for frequency multiplying coupled to said output of said at least one UHF synthesizer circuit and responsive to a first control signal (select X1/X2) to change the frequency of a signal output from said multiplier means (11, 12), thereby selectively changing the operational frequency range of the circuit arrangement and an I/Q modulator means (13) responsive to the output of said VHF synthesizer circuit to provide a modulating signal.

2. A circuit arrangement as set forth in claim 1, wherein said output of each frequency synthesizer circuit (UHF1, UHF2, VHF) is selectable in accordance with a second control signal (Synte sel./Data).

3. A circuit arrangement as set forth in claim 1, further comprising:

a reception branch for receiving a radio frequency (RF) signal;

a first mixer (31) connected to said reception branch and responsive to said radio frequency (RF) signal and further connected to said multiplier means and responsive to a first local oscillator (LO) signal therefrom for providing an intermediate frequency (IF) output signal to processing circuits for a reception signal;

a transmission branch including an amplifier means and an antenna, a second mixer (14) for providing an output signal to be transmitted, said second mixer (14) being connected to said I/Q modulator means (13) and connected to said multiplier means and responsive to a second local oscillator signal therefrom, said second mixer (14) having an output signal connected to said transmission branch for amplification by said amplifier means (51) and for transmission as a transmission signal;

whereby frequencies of the first and second local oscillator signals are formed within said at least one UHF and said VHF circuits (UHF1, UHF2, VHF), and whereby the output signal from said second mixer (14) is derived from a frequency formed in the synthesizer circuit (VHF) of the VHF range and modulated by said I/Q modulator means (13).

4. A circuit arrangement as set forth in claim 3, wherein said modulating signal is an analogue modulation signal.

5. A circuit arrangement as set forth in claim 4, further including sources of a second and a third control signal wherein said second mixer (14) is selectable by said third control signal (Feed through) to direct said second local oscillator signal modulated by said analogue modulation signal to a radio frequency transmission frequency straight through said second mixer (14), whereby the operation of the VHF synthesizer circuit (VHF) is rejected by said second control signal (Synte sel./Data).

6. A circuit arrangement as set forth in claim 1, wherein said modulating signal is provided by the I/Q modulator means (13) and said processing circuits for said reception signal comprise an I/Q demodulator (42) responsive to said intermediate frequency signal from said first mixer and further comprise a divider circuit responsive to frequencies formed from said VHF synthesizer circuit (VHF) to provide demodulated I and Q output signals.

7. A circuit arrangement as set forth in claim 5, wherein when said reference oscillator (71) has a preselected frequency, the operation of said radio telephone can be set to follow a selected radio telephone standard by a preselected combination of values of the first, second and third control signals (Select x1/x3, Synth sel./Data, Feed through).

8. A circuit arrangement as set forth in claim 3, wherein only one intermediate frequency (IF) is used in said reception branch.

9. A circuit arrangement as set forth in claim 3, comprising first, second, third and fourth integrated circuits (IC1 to IC4), wherein
   said first integrated circuit (IC1) substantially comprises said second mixer (14), the I/Q modulator (13), said multiplier means (11, 12) and first amplifier means connected to said multiplier means;
   said second integrated circuit (IC2) substantially comprises said corresponding PLL circuits of said at least one UHF and said VHF synthesizer circuits (21 to 23);
   said fourth integrated circuit (IC4) substantially comprises a digital I/Q demodulator (42) or, alternatively, an analogue I/Q demodulator.

10. A radio frequency circuit for a digital mobile telephone comprising a synthesizer means including a UHF range signal synthesizer circuit for providing first and second local oscillator signals and a VHF range signal synthesizer circuit,
   a reception branch for receiving a radio frequency signal including a first mixer (31) having a first input connected to said radio frequency signal and a second input connected said first local oscillator signal of said synthesizer means for providing an intermediate frequency output signal, and processing circuits connected to said intermediate frequency output signal of said first mixer;
   a transmission branch including a second mixer (14), a source (13) of digital modulating signal selectively connected to said VHF range signal synthesizer, said second mixer (14) having a first input connected to said source (13) of digital modulating signal and a second input connected to said second local oscillator signal of said UHF range signal synthesizer circuit for providing an output RF transmission signal, said second mixer having a third input;
   a source of analogue modulating signal selectively connected to said third input of said second mixer; and
   wherein said synthesizer means further comprises PLL loop circuits connected to a reference oscillator circuit, a source of control signal, and multiplier means connected to the output of said UHF range synthesizer circuit and to said source of control signal for changing the frequency characteristics of said multiplier means.

* * * * *

UNITED STATES PATENT AND TRADEMARK OFFICE
CERTIFICATE OF CORRECTION

PATENT NO. : 5,471,652
DATED : November 28, 1995
INVENTOR(S) : Hulkko

It is certified that error appears in the above-identified patent and that said Letters Patent is hereby corrected as shown below:

IN THE CLAIMS:

In claim 6, col. 6, line 58 delete "1" and replace with --3--.

Signed and Sealed this

Fifth Day of March, 1996

Attest:

BRUCE LEHMAN

Attesting Officer                Commissioner of Patents and Trademarks